(12) United States Patent
Chebiam et al.

(10) Patent No.: US 7,149,085 B2
(45) Date of Patent: Dec. 12, 2006

(54) ELECTROOSMOTIC PUMP APPARATUS THAT GENERATES LOW AMOUNT OF HYDROGEN GAS

(75) Inventors: Ramanan V. Chebiam, Hillsboro, OR (US); Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 10/928,861

(22) Filed: Aug. 26, 2004

(65) Prior Publication Data

US 2006/0044759 A1 Mar. 2, 2006

(51) Int. Cl.
*H05K 7/20* (2006.01)
*F04B 37/02* (2006.01)

(52) U.S. Cl. .......................... 361/699; 417/48; 417/49; 165/80.4

(58) Field of Classification Search .............. 361/699, 361/700; 257/714; 165/80.4; 174/15.1, 174/15.2
See application file for complete search history.

(56) References Cited

U.S. PATENT DOCUMENTS

| | | | |
|---|---|---|---|
| 6,110,808 A * | 8/2000 | Saito | 438/471 |
| 6,426,314 B1 * | 7/2002 | Carroll et al. | 502/150 |
| 6,575,961 B1 * | 6/2003 | Joshi | 604/891.1 |
| 6,720,710 B1 | 4/2004 | Wenzel et al. | |
| 6,890,409 B1 * | 5/2005 | Woudenberg et al. | 204/242 |
| 6,939,451 B1 * | 9/2005 | Zhao et al. | 204/451 |
| 6,986,382 B1 * | 1/2006 | Upadhya et al. | 165/80.4 |
| 6,992,381 B1 * | 1/2006 | Kim et al. | 257/713 |
| 7,021,369 B1 * | 4/2006 | Werner et al. | 165/104.33 |
| 2003/0062149 A1 | 4/2003 | Goodson et al. | |
| 2005/0042110 A1 * | 2/2005 | Corbin et al. | 417/48 |
| 2005/0085018 A1 * | 4/2005 | Kim et al. | 438/122 |
| 2005/0112816 A1 * | 5/2005 | Myers et al. | 438/217 |
| 2005/0139996 A1 * | 6/2005 | Myers et al. | 257/712 |
| 2005/0230080 A1 * | 10/2005 | Paul et al. | 165/47 |

OTHER PUBLICATIONS

Daniel J. Laser, Silicone Electroosmotic Micropumps: Design and Theory of Operation. prototypes, Performance, and Applications. Jun. 2, 2003, 4 Pages.□□http://www.stanford.edu/~dlaser/silicon_eo_pumps/silicone_eo_pumps.htm.*

* cited by examiner

*Primary Examiner*—Boris Chervinsky
(74) *Attorney, Agent, or Firm*—Schwabe, Williamson & Wyatt, P.C.

(57) ABSTRACT

An apparatus that includes an electroosmotic pump and an aqueous or nonaqueous electrolyte liquid and generates relatively low amount of hydrogen gas is described herein. The apparatus may further include a hydrogen absorber.

24 Claims, 3 Drawing Sheets

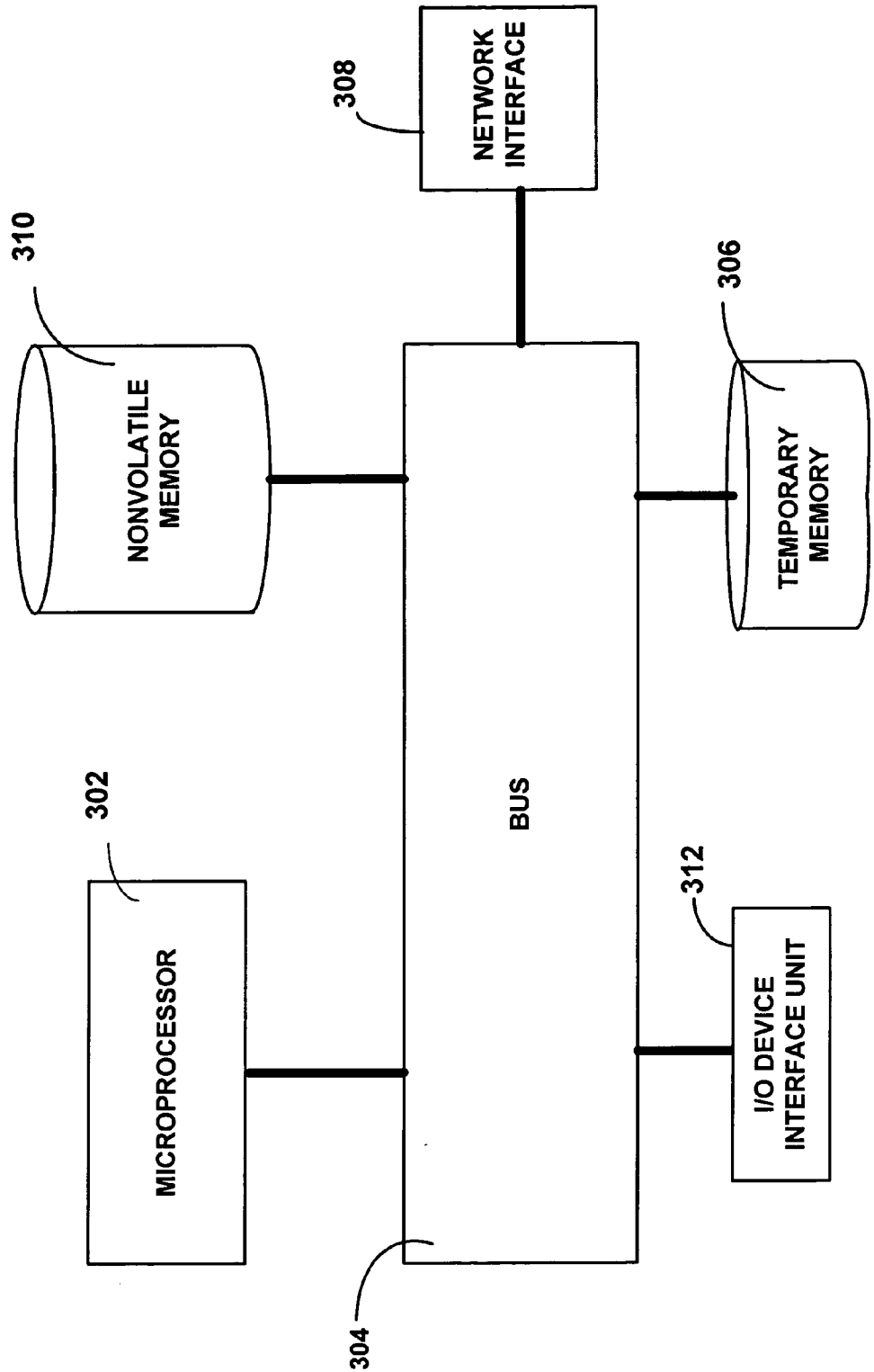

ELECTROOSMOTIC PUMP APPARATUS THAT GENERATES LOW AMOUNT OF HYDROGEN GAS

BACKGROUND OF THE INVENTION

1. Field of the Invention

Embodiments of the present invention relate to, but are not limited to, electronic devices, and in particular, to the field of cooling systems for electronic devices.

2. Description of Related Art

In the current state of integrated circuit technology, cooling systems are often employed to dissipate heat generated by heat-generating devices such as high-speed integrated circuit chips or dice. These cooling systems may be passive, active, or a combination of the two types of cooling systems. A passive type of cooling system is typically comprised of a passive component such as heat spreaders or fins to passively dissipate heat. In contrast, an active cooling system will typically employ some sort of circulation device such as a pump to circulate a medium, such as a liquid coolant, to actively take thermal energy away from the heat-generating device.

As heat-generating devices become smaller, various systems for cooling such devices have been proposed. One such system is a system that employs an electroosmotic pump that circulates an electrolyte liquid around and/or through the heat-generating devices. Electroosmotic pumps, in brief, are pumps that may incorporate electrodes to compel the electrolyte liquid to flow around, for example, a cooling loop.

BRIEF DESCRIPTION OF THE DRAWINGS

The present invention will be described by way of exemplary embodiments, but not limitations, illustrated in the accompanying drawings in which like references denote similar elements, and in which:

FIG. 3 is a block diagram of an example system, according to some embodiments.

DETAILED DESCRIPTION OF ILLUSTRATIVE EMBODIMENTS

Figure 1:
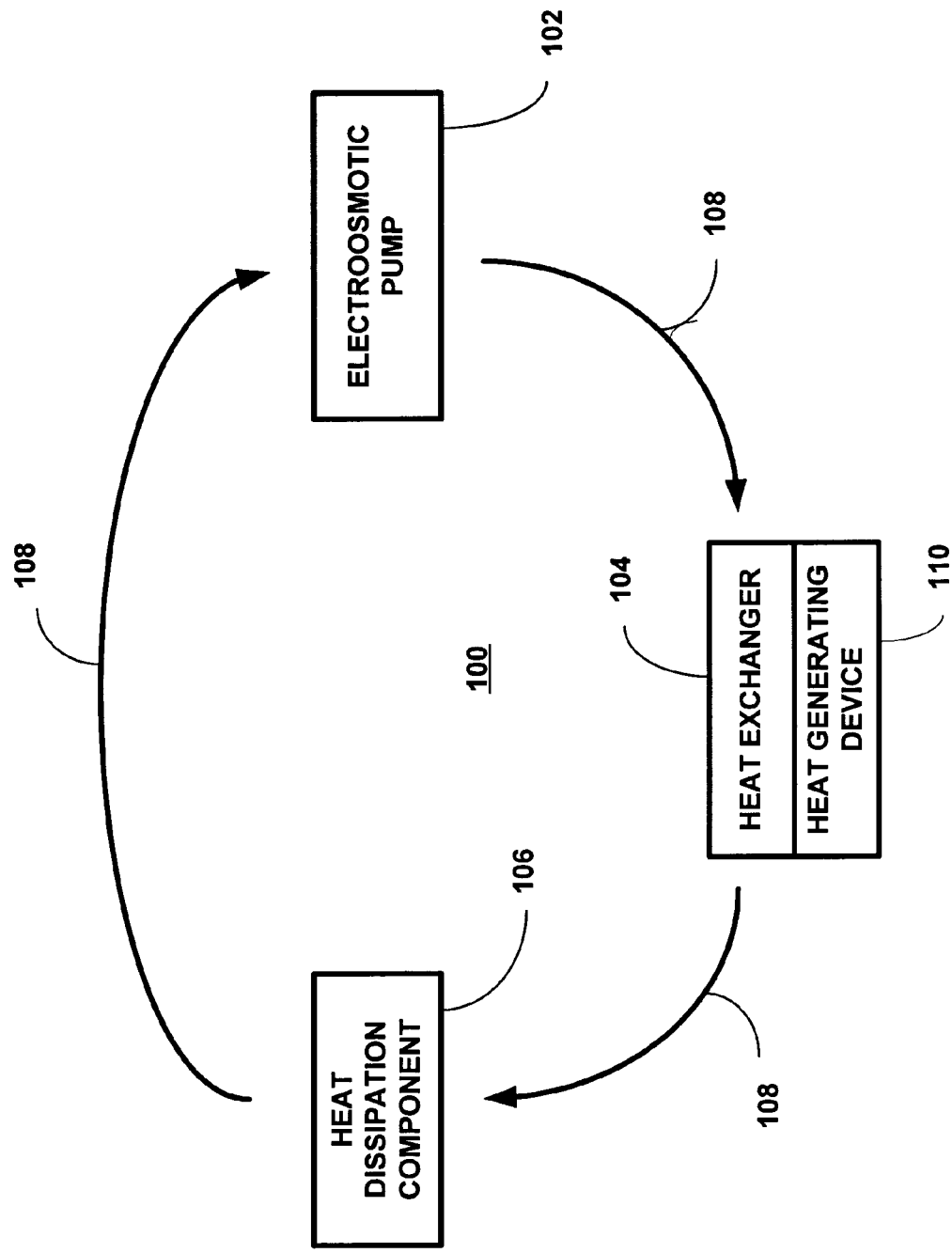
FIG. 1 illustrates a block diagram of an apparatus that includes a cooling system and a heat-generating device in accordance with some embodiments.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

According to various embodiments of the invention, an apparatus that includes one or more electroosmotic pumps and capable of generating a relatively low amount of hydrogen gas is provided. For these embodiments, the one or more electroosmotic pumps may be used to circulate an electrolyte liquid coolant. In some embodiments, the apparatus may further include a heat-generating device, such as a high-speed integrated circuit chip or die, which may be cooled by the circulating electrolyte liquid. In various embodiments, the electrolyte liquid may include an electrolyte salt dissolved in an aqueous or nonaqueous liquid. In some embodiments, the apparatus may include components or materials that may absorb hydrogen that may be present in the electrolyte liquid.

Electroosmotic pumps are generally fabricated with silicon and incorporate electrodes that are formed with a thin layer of platinum. When such electrodes are exposed to hydrogen gas, they may corrode or be destroyed. The corrosion of the electrodes means that the electroosmotic pump's ability to circulate an electrolyte liquid may be compromised or may be made completely ineffectual. Unfortunately, in some situations, hydrogen gas may be generated during the operation of the electroosmotic pump.

According to some embodiments, in order to reduce or eliminate damage to electroosmotic pump components from hydrogen gas exposure, the amount of hydrogen gas that is exposed to these electroosmotic pump components may be reduced. In various embodiments, hydrogen absorbers may be employed to absorb hydrogen gas in the apparatus. In some embodiments, an electrolyte liquid that is nonaqueous may be used to reduce hydrogen gas levels within the apparatus.

In various embodiments, a nonaqueous liquid may be used as the electrolyte liquid. In doing so, hydrogen gas generation may be eliminated during the operation of the electroosmotic pump. Several types of nonaqueous electrolyte liquids may be used in various embodiments as will be described in greater detail below.

In various embodiments, an aqueous liquid may be used as the electrolyte liquid. For these embodiments, the apparatus may further include hydrogen-absorbing components that may reduce the amount of hydrogen gas contained in the aqueous electrolyte liquid. For example, in certain embodiments, hydrogen scavengers may be included with the aqueous electrolyte liquid to absorb hydrogen gas that may be generated during the operation of the electroosmotic pump. In other embodiments, in addition to or in place of the hydrogen scavengers, an electrode that comprises a hydrogen-absorbing material, such as certain alloys, may be used as the electroosmotic pump electrode.

FIG. 1 is a block diagram that depicts an apparatus 100 that includes a heat-generating device and a cooling loop in accordance with some embodiments. For the embodiments, the apparatus 100 includes a closed cooling loop that further includes an electroosmotic pump 102, a heat exchanger 104, and heat dissipation component 106. Circulating through each of these components is an electrolyte liquid, which in this case, acts as a coolant, as indicated by arrows 108. Coupled to the heat exchanger 104 is a heat-generating device 110 such as a die. The die may further be, for example, a high-speed central processing unit (CPU). Note that in other embodiments, the cooling loop may not be a closed cooling loop but, instead, may only be an open cooling loop.

For the embodiments, the electroosmotic pump 102 may be comprised of electrodes (i.e., an anode and a cathode) that generate an electric field and prompts ions contained in the electrolyte liquid to flow in a particular direction thus prompting the electrolyte liquid to flow in a particular direction. In various embodiments, the electrodes may be made of a thin film of platinum. For these embodiments, the electrolyte liquid comprises of electrolytes, such as a salt, dissolved in a solvent, such as water or an organic solvent.

The heat exchanger 104, in some embodiments, may include a substrate that comprises of multiple microchannels. If the heat-generating device 110 is a die or chip, then in some embodiments, the heat exchanger may be coupled to or may even be imbedded in the die substrate. The heat dissipation component 106, in some embodiments, may be a passive heat dissipation device such as heat spreaders or heat sinks.

For these embodiments, the electrolyte liquid flows around a cooling loop from the electroosmotic pump 102 to the heat exchanger 104 to the heat dissipation component 106 and back to the electroosmotic pump 102. As the electrolyte liquid flows through, for example, the microchannels contained in the heat exchanger 104, the electrolyte liquid absorbs the thermal energy generated by the heat-generating device 110. After absorbing the thermal energy from the heat-generating device 110, the electrolyte liquid may flow to the heat dissipation component 106 where the absorbed thermal energy is released or dissipated to, for example, the surrounding environment. After the thermal energy has been dissipated, the electrolyte liquid is recirculated back to the electroosmotic pump 102. Note that in other embodiments, the direction of the electrolyte liquid as indicated by 108 may be reversed so that the electrolyte liquid flows to the electroosmotic pump prior to flowing to the heat dissipation component 106. Note further that in yet other embodiments, the cooling system 100 may not be a closed loop system but may be a fully or partially open loop system.

Figure 2:
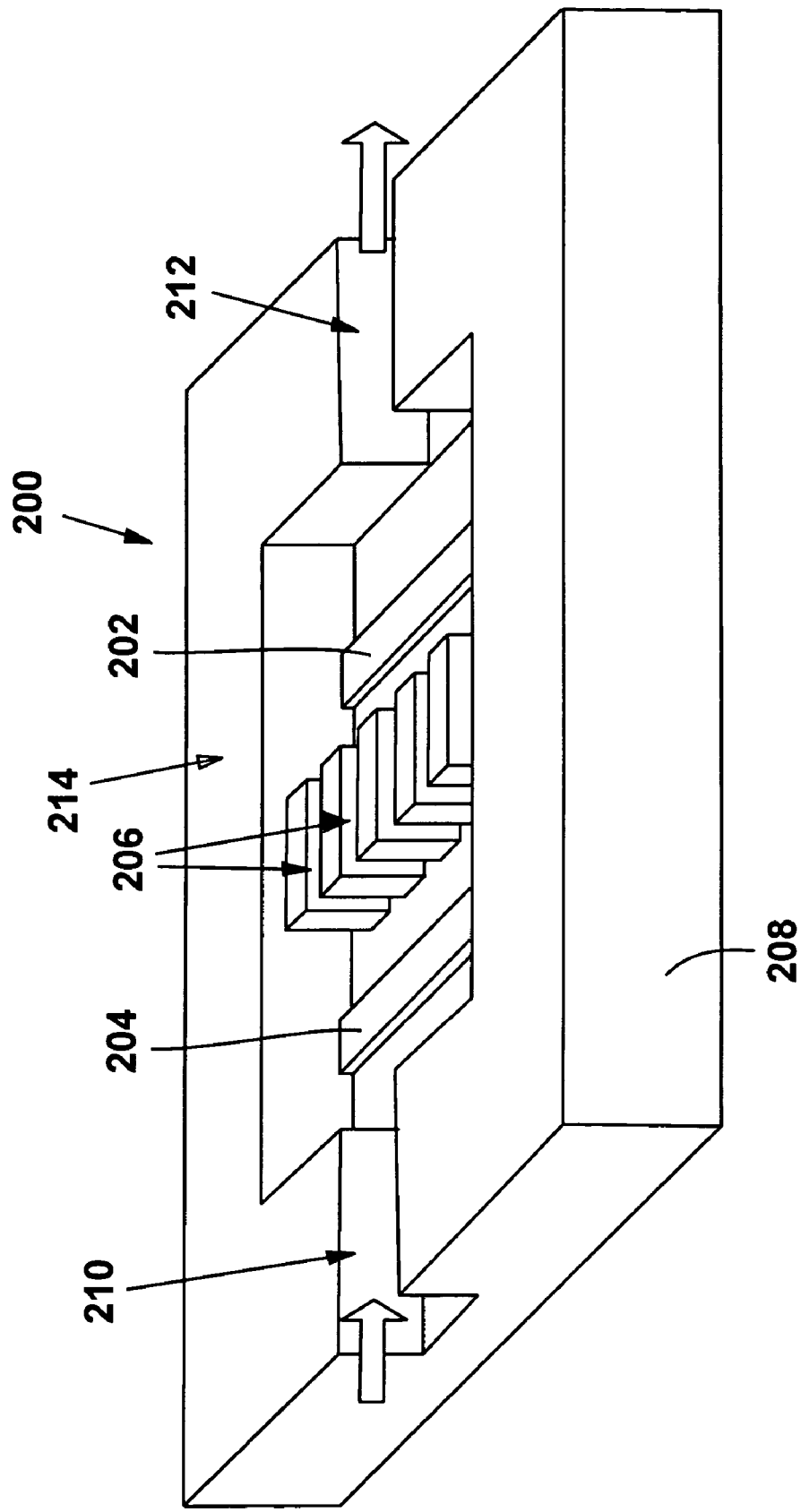
FIG. 2 illustrates a perspective view of an electroosmotic pump in accordance with some embodiments.

Referring to FIG. 2 depicting the electroosmotic pump of FIG. 1, in further detail, in accordance with various embodiments. For the embodiments, the electroosmotic pump 200 includes two electrodes, a cathode 202 and an anode 204 located within a cavity 214. In various embodiments, each of the cathode 202 and the anode 204 may be comprised of a very thin platinum (Pt) strip. Between the cathode 202 and the anode 204 are slots 206 where electroosmotic pumping may occur. The electroosmotic pump 200 may be formed on a silicon substrate 208 that is coated with a nitride. The electroosmotic pump 200 further includes a first opening 210 and a second opening 212.

According to various embodiments, when the electroosmotic pump 200 is in operation, an electrolyte liquid may enter through the first opening 210 and enter the pump cavity 214. As the anode 204 and the cathode 202 are electrically charged, an electric field may be generated. The resulting electric field may then propel the ions contained in the electrolyte liquid to move in one direction (i.e., towards the second opening 212) and as a result, the electrolyte liquid will also be prompted to move in the same direction exiting through the second opening 212.

In various embodiments, an aqueous electrolyte liquid may be used as the electrolyte liquid. As previously described, the electrodes 202 and 204 may comprise of platinum. For these embodiments, the aqueous electrolyte liquid will contain water ($H_2O$), as the solvent, which may react with the electrodes to generate hydrogen gas based on the following reactions:

Anode: $6H_2O(l) \rightarrow O_2(g)+4H_3O+4e^-$
Cathode: $2H_3O^+ +2e^- \rightarrow H_2(g)+OH^-$ The hydrogen gas that may be generated at the cathode may, in turn, react with the platinum in the cathode 202 thus damaging the cathode 202. As a result, the overall performance of the electroosmotic pump may suffer.

According to various embodiments, hydrogen absorbers that absorb hydrogen gas may be included in the apparatus 100. In doing so, the overall amount of hydrogen gas generated may be reduced in some embodiments. For example, in some embodiments, hydrogen scavengers such as ascorbic acid, compounds of antimony, arsenic, tellurium and selenium, may be added to the electrolyte liquid that circulates through the apparatus 100. Such scavengers may seek out hydrogen gas that may be present in the apparatus 100.

In some embodiments, hydrogen-absorbing material, such as certain types of alloys, may be added to the cathode 202. For these embodiments, the hydrogen-absorbing alloys may be formed or deposited on the surface of the cathode 202. By depositing the hydrogen-absorbing material on top of the cathode 202, hydrogen gas that may be contained within the apparatus 100 may be absorbed by the alloys. For example, in some embodiments, the hydrogen-absorbing material may have the formula $AB_5$, where A is lanthanum (La), cerium (Ce), praseodymium (Pr) or (Nd), and B is nickel (Ni) or NiM where M is aluminum (Al), molybdenum (Mo), chromium (Cr), cobalt (Co), nickel (Ni), or manganese (Mn). In other embodiments, the hydrogen-absorbing material may have the formula AB where A is iron (Fe) or FeM' where M' is Ni, Mo, Cr and Co, and B is titanium (Ti). In yet other embodiments, the hydrogen-absorbing material may have the formula $A_2B$ where A is magnesium (Mg), and B is Ni. In yet other embodiments, the hydrogen-absorbing material may have the formula $AB_2$ where A is zirconium (Zr), and B is vanadium (V) or Ni.

For these embodiments, the hydrogen that is absorbed by the hydrogen-absorbing material may be desorbed in subsequent operations such as operations that elevate the temperature of the hydrogen-absorbing material and/or increase the pressure of the surrounding environment.

In various embodiments, the electrolyte liquid circulating through the apparatus 100 may be a nonaqueous electrolyte liquid. In various embodiments, the nonaqueous electrolyte liquid may be electrically conductive. For these embodiments, nonaqueous liquids, such as ethylene carbonate or propylene carbonates, may replace water as the solvent for the electrolytes. A suitable electrolyte, for example, a salt such as $LiPF_6$, $LiBF_4$, $LiAsF_6$, $LiAlCl_4$, and the like, may be added to the nonaqueous liquid to form the nonaqueous electrolyte liquid. For these embodiments, since there is no water in the electrolyte liquid, hydrogen gas is generally not generated during the operation of the electroosmotic pump.

Referring now to FIG. 3, where a system 300 in accordance with some embodiments is shown. The system 300 includes a microprocessor 302 that may be coupled to a bus 304. The system 300 may further include temporary memory 306, a network interface 308, an optional nonvolatile memory 310 (such as a mass storage device) and an input/output (I/O) device interface unit 312. In some embodiments, the input/output device interface unit 312 may be adapted to interface a keyboard, a cursor control device, and/or other devices. One or more of the above-enumerated elements, such as microprocessor 302, temporary memory 306, nonvolatile memory 310, and so forth, may be included in the novel apparatus described above.

Depending on the applications, the system 300 may include other components, including but not limited to chipsets, RF transceivers, mass storage (such as hard disk, compact disk (CD)), digital versatile disk (DVD), graphical or mathematic coprocessors, and so forth.

One or more of the system components may be located on a single chip such as a system on chip (SOC). In various embodiments, the system 300 may be a personal digital assistant (PDA), a wireless mobile phone, a tablet computing device, a laptop computing device, a desktop computing device, a set-top box, an entertainment control unit, a digital camera, a digital video recorder, a media recorder, a media player, a CD player, a DVD player, a network server, or device of the like.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An apparatus, comprising:
   an electroosmotic pump; and
   a nonaqueous electrolyte liquid to circulate through the electroosmotic pump,
      wherein the nonaqueous electrolyte liquid comprising a solvent selected from the group consisting of ethylene carbonate and propylene carbonate.

2. The apparatus of claim 1, wherein the nonaqueous electrolyte liquid comprising a salt selected from the group consisting of $LiPF_6$, $LiBF_4$, $LiAsF_6$ and $LiAlCl_4$.

3. The apparatus of claim 1, further comprises a die, the nonaqueous electrolyte liquid to circulate around or through the die.

4. The apparatus of claim 1, further comprises a passive heat dissipation component, the nonaqueous electrolyte liquid to circulate through the passive heat dissipation component.

5. The apparatus of claim 1 wherein the nonaqueous electrolyte liquid is an aqueous electrolyte liquid comprising a hydrogen scavenger, wherein the hydrogen scavenger is ascorbic acid.

6. The apparatus of claim 1 wherein the nonaqueous electrolyte liquid is an aqueous electrolyte liquid and the electroosmotic pump having a cathode that comprises a hydrogen absorber having the formula $AB_5$, wherein A is one selected from the group consisting of La, Ce, Pr or Nd and B is one selected from the group consisting of Ni and NiM where M is Al, Mo, Cr, Co, Ni or Mn.

7. The apparatus of claim 1 wherein the nonaqueous electrolyte liquid is an aqueous electrolyte liquid and the electroosmotic pump having a cathode that comprises a hydrogen absorber having the formula AB and A is one selected from the group consisting of Fe and FeM' where M' is Ni, Mo, Cr or Co, and B is Ti.

8. The apparatus of claim 1, wherein the nonaqueous electrolyte liquid is an aqueous electrolyte liquid and the electroosmotic pump having a cathode that comprises a hydrogen absorber having the formula $A_2B$, wherein A is Mg and B is Ni.

9. The apparatus of claim 1, wherein the nonaqueous electrolyte liquid is an aqueous electrolyte liquid and the electroosmotic pump having a cathode that comprises a hydrogen absorber having the formula $AB_2$, wherein A is Zr and B is one selected from the group consisting of V and Ni.

10. The apparatus of claim 5 further comprises a die, the aqueous electrolyte liquid to circulate around or through the die.

11. The apparatus of claim 5 further comprises a passive heat dissipation component, the aqueous electrolyte liquid to circulate through the passive heat dissipation component.

12. A method, comprising:
    providing an electroosmotic pump; and
    circulating through the electroosmotic pump a nonaqueous electrolyte liquid;
       wherein the nonaqueous electrolyte liquid comprising a solvent selected from the group consisting of ethylene carbonate and propylene carbonate.

13. The method of claim 12, wherein said circulating comprises circulating a non-aqueous electrolyte liquid comprising a salt selected from the group consisting of $LiPF_6$, $LiBF_4$, $LiAsF_6$ and $LiAlCl_4$, through the electroosmotic pump.

14. The method of claim 12, further comprises circulating the nonaqueous electrolyte liquid around or through a die.

15. The method of claim 12, wherein the nonaqueous electrolyte liquid is an aqueous electrolyte liquid containing a hydrogen scavenger, wherein the hydrogen scavenger is ascorbic acid.

16. The method of claim 15, further comprises circulating the aqueous electrolyte liquid around or through a die.

17. The method of claim 12, wherein the nonaqueous electrolyte liquid is an aqueous electrolyte liquid and said circulating comprises of circulating the aqueous electrolyte liquid over an electroosmotic pump cathode that comprises of a hydrogen absorber having the formula $AB_5$, wherein A is one selected from the group consisting of La, Ce, Pr or Nd and B is one selected from the group consisting of Ni and NiM where M is Al, Mo, Cr, Co, Ni or Mn.

18. The method of claim 17, further comprises circulating the aqueous electrolyte liquid around or through a die.

19. A system, comprising:
    an apparatus, including:
       an electroosmotic pump; and
       a nonaqueous electrolyte liquid to circulate through the electroosmotic pump,
          wherein the nonaqueous electrolyte liquid comprising a solvent selected from the group consisting of ethylene carbonate and propylene carbonate;
    a bus coupled to the apparatus; and
    a mass storage coupled to the bus.

20. The system of claim 19, wherein the apparatus further comprises a die, the nonaqueous electrolyte liquid to circulate around or through the die.

21. The system of claim 19, wherein the nonaqueous electrolyte liquid is an aqueous electrolyte liquid and the apparatus further comprises a hydrogen absorber, the hydrogen absorber is an absorber selected from the group consisting of an ascorbic acid and a hydrogen-absorbing material having the formula $AB_5$, wherein A is one selected from the group consisting of La, Ce, Pr or Nd and B is one selected from the group consisting of Ni and NiM where M is Al, Mo, Cr, Co, Ni or Mn.

22. The system of claim 21, wherein the apparatus further comprises a die, the aqueous electrolyte liquid to circulate around or through the die.

23. The system of claim 19, wherein the system further comprises an input/output device interface unit adapted to interface at least a selected one of a keyboard and a cursor control device.

24. The system of claim 19, wherein the system is a selected one of a set-top box, a digital camera, a CD player, or a DVD player, a wireless mobile phone, a tablet computing device, a laptop computing device.

* * * * *